(12) United States Patent
Tsai

(10) Patent No.: US 6,258,688 B1
(45) Date of Patent: Jul. 10, 2001

(54) METHOD TO FORM A HIGH Q INDUCTOR

(75) Inventor: Chao-chieh Tsai, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/525,671

(22) Filed: Mar. 15, 2000

(51) Int. Cl.⁷ ............................................. H01L 21/4763
(52) U.S. Cl. .................... 438/381; 438/618; 257/516; 257/531
(58) Field of Search ........................... 438/618, 381; 257/516, 531

(56) References Cited

U.S. PATENT DOCUMENTS

| | | | |
|---|---|---|---|
| 5,376,560 | 12/1994 | Aronowitz et al. | 437/24 |
| 5,539,241 | * 7/1996 | Abidi et al. | 257/531 |
| 5,717,243 | * 2/1998 | Lowther | 257/531 |
| 5,742,091 | * 4/1998 | Hebert | 257/531 |
| 5,773,870 | 6/1998 | Su et al. | 257/531 |
| 5,930,637 | 7/1999 | Chuang et al. | 438/381 |
| 5,952,704 | * 9/1999 | Yu et al. | 257/531 |
| 6,008,102 | * 12/1999 | Alford et al. | 238/381 |
| 6,030,877 | * 2/2000 | Lee et al. | 438/381 |
| 6,046,109 | * 2/2000 | Liao et al. | 438/689 |
| 6,057,202 | * 5/2000 | Chen et al. | 438/381 |
| 6,069,397 | * 5/2000 | Cornett et al. | 257/531 |
| 6,166,422 | * 12/2000 | Qian et al. | 257/531 |
| 6,169,008 | * 1/2000 | Wen et al. | 438/381 |

* cited by examiner

Primary Examiner—Matthew Smith
Assistant Examiner—Granvill Lee, Jr.
(74) Attorney, Agent, or Firm—George O. Saile; Stephen B. Ackerman

(57) ABSTRACT

A new method is provided for the creation of a high Q inductor. STI trenches are etched for both the active region and the inductor region. The location of the STI region for the inductor is removed from the active region by a significant distance. A thick layer of photoresist is deposited over the surface of the substrate that does not coincide with the surface of the substrate over which the inductor is to be created. A high-energy ion implant is performed after which the thick layer of photoresist is removed. The inside surfaces of the STI trenches are lined after which the STI trenches are filled and the process of creating the semiconductor device proceeds, using conventional methods of fabrication of active components and the inductor whereby the inductor is created overlying the surface of the substrate into which the high-energy ion implant has been performed.

10 Claims, 4 Drawing Sheets

METHOD TO FORM A HIGH Q INDUCTOR

BACKGROUND OF THE INVENTION

(1) Field of the Invention

The invention relates to the fabrication of integrated circuit devices, and more particularly, to a method of forming a high Q inductor on the surface of a semiconductor substrate by applying methods that sharply reduce electromagnetic losses in the surface of the substrate.

(2) Description of the Prior Art

Most applications of semiconductor devices address the manipulation of data in digital form whereby the digital form is represented in the devices by on-off conditions of switching transistors that make up the semiconductor device. These applications are however supplemented with applications that in addition address the manipulation of analog signals. Electronic circuitry can therefore be divided into two broad fields, one field that addresses digital processing while the second field addresses the manipulation of analog signals. The vast majority of semiconductor devices that are fabricated have as function the manipulation or storage of digital information, a function that is handled by on-off conditions of switching transistors or the presence or absence of an electrical charge on capacitive components. There is however, in addition, a field of semiconductor applications that addresses the processing of analog signals. The functions of analog electronic circuitry have in previous years typically been handled by separate components such as relatively large capacitors or relatively large inductors. The separate components may have been applied in combination with digital processing capabilities, whereby a significant portion of the functional implementation has been realized by the use of for instance capacitive and inductive components in addition to and functionally collaborating with the digital components. Circuit requirements that are imposed on components that are required for analog processing have in the past limited the integration of such components into typical semiconductor integrated circuit devices.

In addition, semiconductor devices can be integrated for the creation of Radio Frequency (RF) amplifiers. A major component of typical RF amplifiers is a tuned circuit that contains inductive and capacitive components. The tuned circuit has as electrical characteristic that, dependent on and determined by the values of its inductive and capacitive components, can form an impedance that is frequency dependent which enables the tuned circuit to either form a high or a low resistance for signals of particular frequencies. In this manner the tuned circuit can either reject or pass and further amplify components of an analog signal based on the frequency of that component. This tuned circuit can therefore be used as a filter to filter out or remove signals of certain frequencies or to remove noise from a circuit configuration that is aimed at manipulating analog signals. The tuned circuit can also be used to form a high electrical impedance by using the LC resonance of the circuit and to thereby counteract the effect of parasitic capacitances that form part of a circuit. The self-resonance that is caused by the parasitic capacitance between the (spiral) inductor and the underlying substrate will limit the use of the inductor at high frequencies.

The integration of functions of analog data manipulation and analog data storage with the functions of digital data manipulation and digital data storage on one semiconductor monolithic substrate offers a number of important advantages. For instance, manufacturing costs can be significantly reduced while power consumption for the combined functions can also be reduced. As previously indicated, inductors however can be of significant size and therefore require a considerable area of the semiconductor device to be implemented. To limit the impact of space requirements that the creation of an inductor imposes on the surface of a semiconductor device, inductors are typically formed on the surface of a substrate in a spiral form. The spiral form of the inductor however results in parasitic capacitances between the inductor wiring and the underlying substrate, due to the physical size of the inductor. These parasitic capacitances have a serious negative effect on the functionality of the created LC circuit by sharply reducing the frequency of resonance of the tuned circuit of the application.

A measure of the applicability of a created inductor that is used in the industry is the Quality factor of the inductor. The quality factor Q of an inductor is defined as follows: $Q=Es/El$ wherein Es is the energy that is stored in the reactive portion of the component while El is the energy that is lost in the reactive portion of the component. The higher the quality of the component, the closer the resistive value of the component approaches zero while the Q factor of the component approaches infinity. The quality factor for components differs from the quality that is associated with filters or resonators. For components, the quality factor serves as a measure of the purity of the reactance (or the susceptance) of the component which can be degraded due to parasitics. In an actual configuration, there are always some physical resistors that will dissipate power thereby decreasing the power that can be recovered. The quality factor Q is dimensionless. A Q value of greater than 100 is considered very high for discrete inductors that are mounted on the surface of Printed Circuit Boards. For inductors that form part of an integrated circuit, the Q value is typically in the range between about 3 and 10.

In creating an inductance on a monolithic substrate on which additional semiconductor devices are created, the parasitic capacitances that occur as part of this creation limit to about 10 the quality factor that can be achieved for the inductor using the conventional silicon process. This limitation is, for many applications, not acceptable. Dependent on the frequency at which the LC is designed to resonate, significantly larger values of quality factor, of for instance 100 or more, must be available. Prior Art has in this been limited to creating values of higher quality factors as separate units, and integrating these separate units with the surrounding device functions. This negates the advantages that can be obtained when using the monolithic construction of creating both the inductor and the surrounding devices on one and the same semiconductor substrate. The non-monolithic approach also has the disadvantage that additional wiring is required to interconnect the sub-components of the assembly thereby again introducing additional parasitic capacitances and resistive losses over the interconnecting wiring network. For many of the applications of the RF amplifier, such as portable battery powered applications, power consumption is at a premium and must therefore be as low as possible. By raising the power consumption, the effects of parasitic capacitances and resistive power loss can be partially compensated but there are limitations to even this approach. These problems take on even greater urgency with the rapid expansion of wireless applications such as portable telephones and the like. Wireless communications is a rapidly expanding market where the integration of RF integrated circuits is one of the most important challenges. One of the approaches is to significantly increase the frequency of operation to for instance the range of 10 to 100

GHz. For such high frequencies, the values of the quality factor obtained from silicon-based inductors are significantly degraded. For applications in this frequency range, monolithic inductors have been researched using other than silicon as the base for the creation of the inductors. Such monolithic inductors have for instance been created using sapphire or GaAs as a base. These inductors have a considerably lower parasitic capacitance than their silicon counterparts and therefore provide higher frequencies of resonance of the LC circuit. Where however more complex applications are required, the need still exists to create inductors using silicon as a substrate. For those applications, the approach of using a base material other than silicon has proven to be too cumbersome while for instance GaAs as a medium for the creation of semiconductor devices is as yet a technical challenge that needs to be addressed.

The incorporation of RF inductors without sacrificing device performance due to substrate losses has been extensively researched in recent years. Some of the techniques that have been used for this approach include:

- the selective removing (by etching) of the silicon underneath the inductor (using methods of micro-machining)
- using multiple layers of metal (such as aluminum) interconnects or of copper damascene interconnects
- using a high resistivity silicon substrate
- employing biased wells underneath a spiral conductor
- inserting various types of patterned ground shields between the spiral inductor and the silicon substrate
- increasing the thickness of the inter-layer dielectric.

The above listing of researched alternatives is not meant to be complete or all inconclusive. All of the above approaches have as common objectives to:

1) enhance the quality (Q) value of the inductor, and
2) increase the frequency of the LC self-resonance thereby increasing the frequency range over which the inductor can be used.

U.S. Pat. No. 5,930,637 (Chuang et al.) shows a method comprising form isolation regions, blanket I/I ions into the substrate, form dielectric layer, form an inductor over dielectric layer and substrate/blanket I/I regions. This is close to the invention.

U.S. Pat. No. 5,376,560 (Aronowitz) shows an amorphizing I/I on a Si substrate with isolation area above.

U.S. Pat. No. 5,773,870 (Su et al.) teaches an inductor on the upper plane of a membrane.

SUMMARY OF THE INVENTION

A principle objective of the invention is to negate or minimize resistive losses that are typically experienced by inductive components that are mounted on the surface of a silicon substrate.

In accordance with the objectives of the invention a new method is provided for the creation of a high Q inductor. The process of the invention starts with the creation of an STI region that underlies the region where the inductor is to be created, STI trenches are etched for both the active region and the inductor region in order to provide improved electrical isolation. The location of the STI region for the inductor is removed from the active region by a significant distance. A thick layer of photoresist is deposited over the surface of the substrate that does not coincide with the surface of the substrate over which the inductor is to be created. This layer of photoresist serves as a shield during a following high-energy Si or Ge ion implant in that region of the surface of the substrate over which the inductor is to be created. The results of the high-energy Si or Ge implant is that the molecular structure of the silicon into which the implant penetrates is amorphized, resulting in a sharp increase of the resistivity that is experienced by the magnetic field of the superimposed conductor while this magnetic field passes through the substrate. The net effect of this amorphization is that the strength of the magnetic field of the inductor is reduced where this magnetic field passes through the substrate and therefore amplified above this surface thereby increasing the Q value of the overlying inductor. After the high-energy ion implant is performed, the thick layer of photoresist is removed. The inside surfaces of the STI trenches are lined after which the STI trenches are filled and the process of creating the semiconductor device proceeds using conventional methods of fabrication of active components and the inductor whereby the inductor is created overlying the surface of the substrate into which the high-energy ion implant has been performed.

BRIEF DESCRIPTION OF THE DRAWINGS

FIG. 8 shows the contours of a typical inductor, as follows:

DESCRIPTION OF THE PREFERRED EMBODIMENTS

The invention addresses the effect that the series spreading resistance associated with the substrate will degrade the Q factor of the inductor thereby affecting the usefulness of a monolithic or integrated inductor that is implemented on silicon substrates. This effect can be overcome if the area underneath the inductor can be made to appear locally insulating by selectively removing and/or modifying the crystalline structure of the underlying silicon substrate. The inductor of the invention is created above regions of Shallow Trench Isolation (STI) whereby the negative impact that an underlying layer of silicon has is further reduced by high-energy implanting of silicon (Si) or germanium (Ge). The silicon underneath the region where the inductor is created is amorphized by the implant of either silicon or germanium into the silicon surface, after amorphization the underlying silicon is converted into a semi-insulator that inhibits the formation of eddy currents thereby inhibiting the dissipation of electromagnetic energy resulting in an increased Q factor for the overlying inductor.

Figure 1:
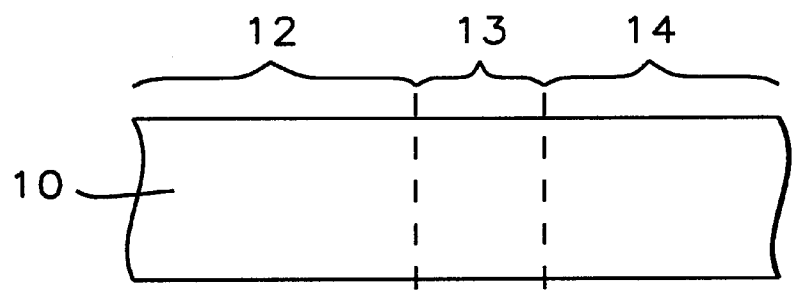
FIG. 1 shows as cross section of a silicon substrate where the surface of the substrate has been divided into an active region, a region over which an inductor is to be created and a region of isolation between these two regions.

Referring now specifically to FIG. 1, there is shown a cross section of a substrate 10 on the surface of which an inductor will be formed in accordance with the process of the invention. The surface area of the substrate 10 is divided into three regions, region 12 is the surface of the substrate 10 into which active devices have been formed, region 13 is the region of electrical isolation between regions 12 and 14 while region 14 is the surface area of the substrate over which the inductor will be formed.

Figure 2:
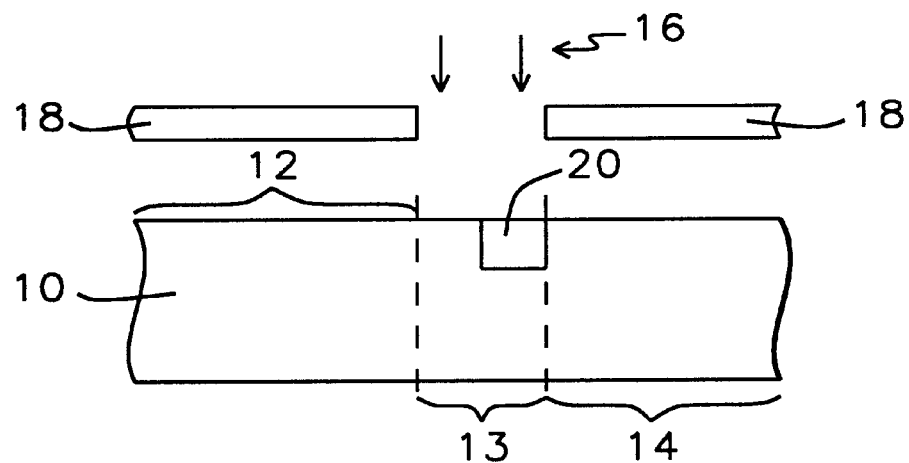
FIG. 2 shows a cross section of the substrate into which a N+ implant is being performed.

FIG. 2 shows a cross section of the substrate 10 after an N+ implant 16 has been performed into the surface of substrate 10 by using mask 18. This implant serves to form a diffusion barrier or region of high electrical resistance between the subsequently to be formed STI regions. Implant 16 is a typical N+ type implant of arson or phosphorous that can be applied at an energy between about 25 and 75 KeV and a dose between about 5E11 and 5E13 atoms/cm$^3$. Implant 16 forms the N+ region 20 in the surface of substrate 10.

Figure 3:
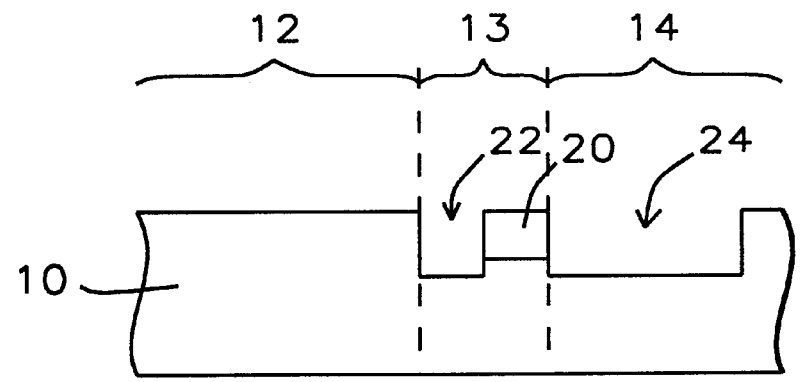
FIG. 3 shows a cross section of the substrate after STI trenches have been etched.

FIG. 3 shows how the active region 12 is further electrically isolated from the surface 14 of the regions above which the inductor is to be formed. This electrical isolation is achieved by etching trench 22 in the surface of substrate 20. The process of creating the STI trench is performed mainly by plasma etching. Basically, in plasma etching as applied in the manufacturing of silicon integrated devices, a chamber that contains two electrodes is used whereby a first electrode is positioned opposite a second electrode. The silicon substrate is positioned on a first electrode in the chamber. While a compound gaseous medium is flowed through the chamber, an r-f voltage, which may include components at different frequencies, is applied between the two electrodes to create a discharge that ionizes the gaseous medium in the chamber and that forms a plasma that etches the wafer. Typical gasses that are used as an etchant gas for this process are one or more halogenated compounds. For example, $CF_4$, $CHF_3$ (freon 23) $SF_6$, $NF_3$, can be used. Added can be gases such as $O_2$, Ar, and $N_2$. By appropriate choice of the gasses of the gaseous medium and the parameters of the discharge, selective and anisotropic etching is achieved.

Applying the same technology as indicated above for the creation of trench 22, a trench 24 is created in the surface of substrate 10. Trench 24 is created in surface 14 of the substrate 10 whereby surface 14 is the surface area of the substrate over which the inductor is to be created. Trenches 22 and 24 can be simultaneously created using one processing sequence.

STI's regions can typically be made using a number of methods. For instance, one method is the Buried Oxide (BOX) isolation used for shallow trenches. The method involves filling the trenches with a chemical vapor deposition (CVD) silicon oxide ($SiO_2$) and then etched back or mechanically or chemically polished to yield a planar surface. The shallow trenches etched for the BOX process are anisotropically plasma etched into the silicon substrate and are typically between 0.5 and 0.8 micrometer (um.) deep. STI can be formed around active device to a depth between 4000 and 20000 Angstrom.

Another approach in forming STI's is to deposit silicon nitride on thermally grown oxide. After deposition of the nitride, a shallow trench is etched into the substrate using a mask. A layer of oxide is then deposited into the trench so that the trench forms an area of insulate dielectric which acts to isolate the devices in a chip and thus reduce the cross talk between active devices. The excess deposited oxide must be polished off and the trench planarized to prepare for the next level of metalization. The silicon nitride is provided to the silicon to prevent polishing of the masked silicon oxide of the device.

It must be noted from FIG. 3 that the creation of trench 22 in addition to the creation of the N+ region 20 assures that the inductor is located relatively far removed from the active region 12 of the substrate 10. This is important to the process of the invention since this assures optimum insulation between the active region of the substrate and the region of the substrate that underlies the inductor.

Figure 4:
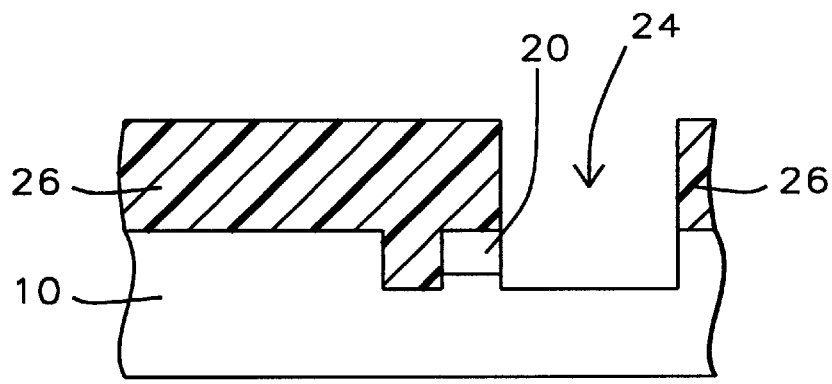
FIG. 4 shows a cross section of the substrate after a thick layer of photoresist has been deposited and etched.

FIG. 4 shows a cross section of the substrate 10 after a thick layer 26 of photoresist has been deposited and patterned. It is clear from the cross section that is shown in FIG. 4 that the layer 26 of photoresist covers all of the surface of the substrate 10 with the exception of the surface of the STI trench 24.

The patterned layer 26 is formed by applying photolithography techniques wherein the patterned layer 26 is formed by spinning on a layer of photoresist, projecting light through a photomask with the desired pattern onto the photoresist to expose the photoresist to the pattern, developing the photoresist, washing off the undeveloped photoresist, and plasma etching to clean out the areas where the photoresist has been washed away. The remaining resist 26 on the surface of the substrate 10 forms the desired pattern.

A layer of photoresist can be etched by applying $O_2$ plasma and then wet stripping by using $H_2SO_4$, $H_2O_2$ and $NH_4OH$ solution. Sulfuric acid ($H_2SO_4$) and mixtures of $H_2SO_4$ with other oxidizing agents such as hydrogen peroxide ($H_2O_2$) are widely used in stripping photoresist after the photoresist has been stripped by other means. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

Figure 5:
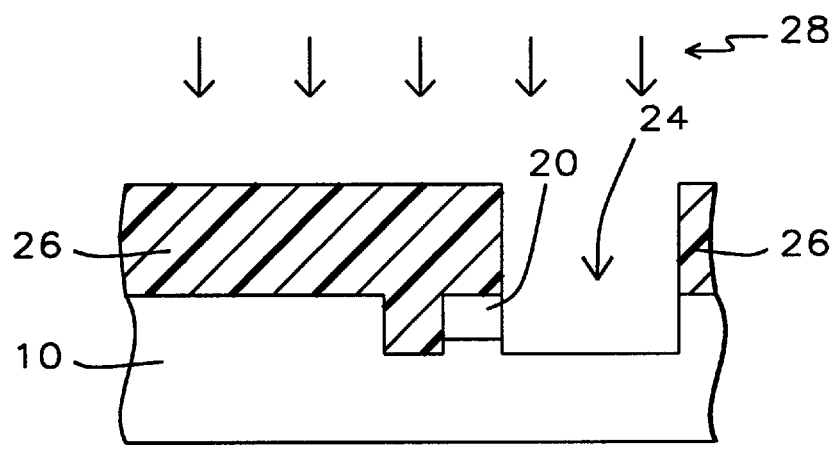
FIG. 5 shows a cross section of the substrate into which a high-energy Si or GE implant is being performed.

The next step in the process of the invention is shown in FIG. 5, this step is a central concept in the application of the invention. This step significantly reduces the resistive losses (that are typically suffered by the electromagnetic field of an inductor that is created on the surface of a substrate) where the electromagnetic field of the inductor passes through the underlying substrate. A process of Si or Ge high-energy ion implant results in the amortization of the region where the implant is made converting this region into a semi-insulator where eddy currents will therefore not occur and where therefore no electromagnetic energy will be dissipated. This is a key aspect of the invention and a major contributor to increasing the Q factor of the overlying inductor. The region in the surface where the amortization essentially takes place has been highlighted as region 30, FIG. 6, it is clear that this region 30 underlies the surface 24 of the substrate 10 over which the inductor is to be created.

Implant 28 can be performed into the silicon substrate 10 at an energy of about 1 to 10 MeV and at a dose of about $1 \times 10^{15}$ to $5 \times 10^{15}$ atoms/cm$^2$. The width of the implanted region 30 is less than the width of the STI trench 24 since the region where the electromagnetic field of the inductor penetrates the silicon surface does not extend over the full width of the STI trench 24 but is roughly centered around the geometric center of trench 24.

Patterned layer 26 of photoresist is next removed from the surface of substrate 10 applying methods of photoresist removal and clean up that have previously been highlighted.

The next step of the process of the invention is the filling of the STI trenches 22 and 24. Before the STI trenches 22 and 24 are filled, a liner of pad oxide can be formed on the inside surfaces of the STI trenches. The pad oxide liner is typically formed to a thickness of about 150 Angstrom through a thermal oxidation method at a temperature of about 900 degrees C. for a time period of about 10 to 20 minutes. The purpose of this liner is to cushion the transition of the stress between the silicon substrate and the subsequently deposited layer of STI fill. The filling of the STI trenches 22 and 24 can use Buried Oxide (BOX) isolation. The trenches are filled with a chemical vapor deposition (CVD) silicon oxide ($SiO_2$) and then etched back or mechanically or chemically polished to yield a planar surface.

Figure 6:
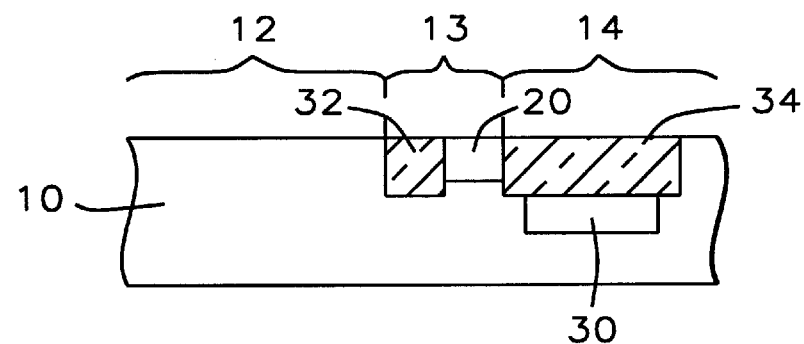
FIG. 6 shows a cross section of the substrate after the thick layer of photoresist has been removed and after the STI trenches have been filled.

FIG. 6 shows a cross section of the substrate 10 in the surface of which have been created:
region 12 which is the region that contains active devices
region 13 which isolates the active devices from the region 14 in the surface of substrate 10 overlying which an inductor is to be created
region 14 which is the region above which an inductor is top be created
N+ region 20, a first part of the isolation region 13
region 30 of amorphized silicon in the surface of the substrate 10
region 32 of STI, a second part of the isolation region 13 for the insulation of the active region 12 from the region 14 over which the inductor will be created, and
region 34 of STI to form the region in the surface of substrate 10 over which the inductor will be created.

Figure 7:
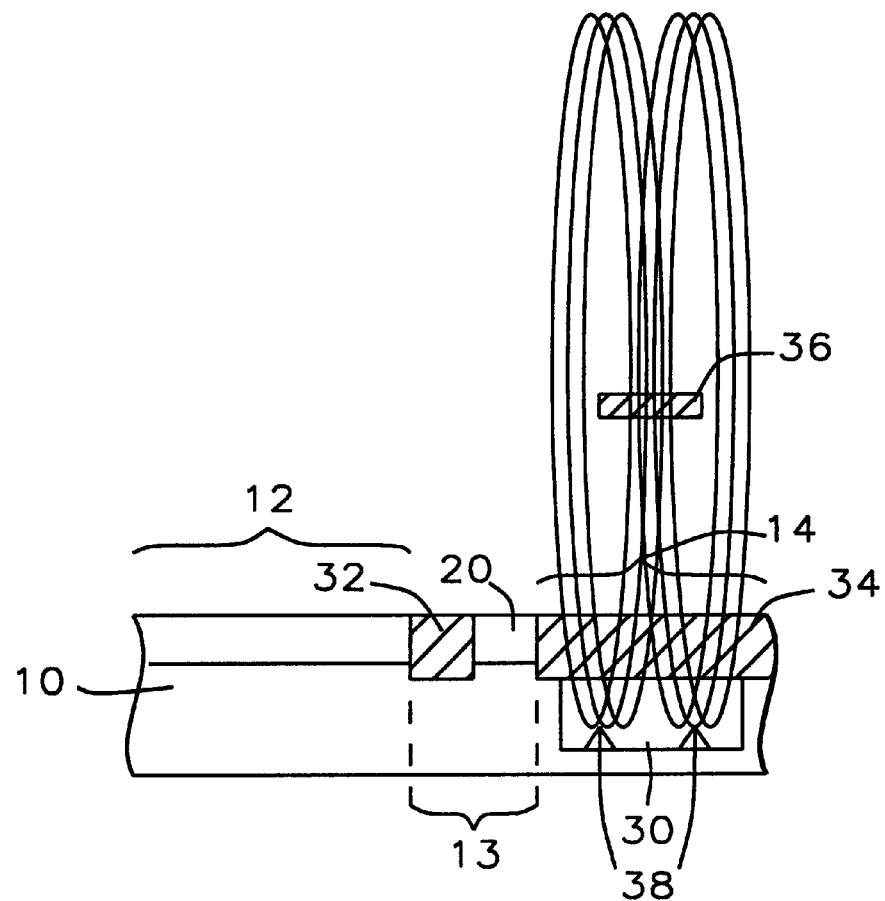
FIG. 7 shows a cross section of the substrate with an inductor created above the surface of the substrate.

The process of the invention can now proceed applying conventional methods of creating a semiconductor device that include the creation of an inductor on the surface of the substrate 10 overlying region 14 in that surface, whereby this completion may include the incorporation of other passive devices, the creation of contact points overlying the active region 12 for (for instance) the connection of BGA devices and the like. Implied in this completion is the deposition of a layer of dielectric (not shown in FIG. 6) over the surface of the substrate 10 whereby this layer of dielectric separates the location of the inductor from the surface of the substrate 10. The cross section that is shown in FIG. 7 illustrates this further where it is obvious that the inductor 36 is located above and relatively removed from the surface of substrate 10. Regions of special interest to the invention of the regions that have been highlighted as regions 38. In regions 38 the electromagnetic field 40 of the inductor 36 passes through the silicon of the substrate 10. It is in these regions that the silicon of substrate 10 has been amortized following the process of the invention leading to regions 38 of semi-insulator resulting in the prevention of eddy current in these regions resulting in increased Q value for inductor 36.

Figure 8A:
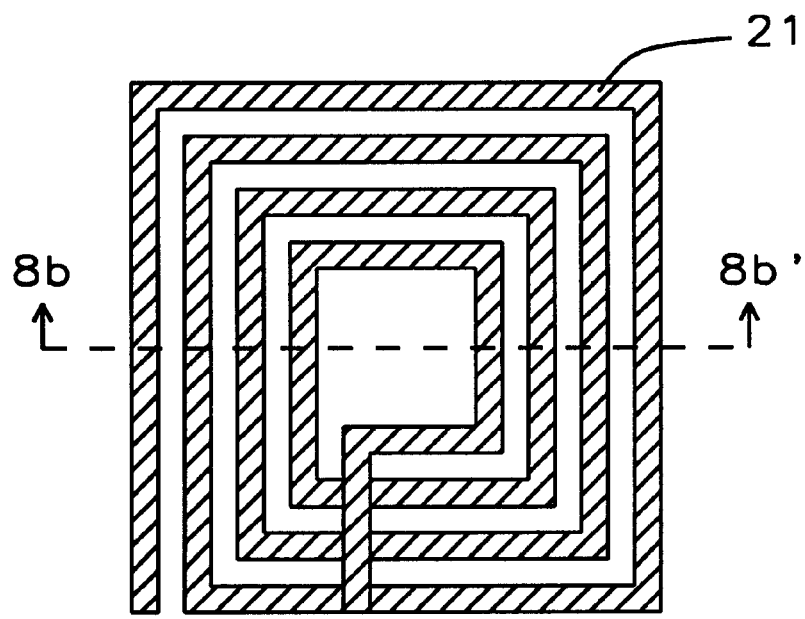
FIG. 8a shows a top view of a typical inductor construction.

FIG. 8a shows a top view of a typical inductor 21, the inductor that is shown in FIG. 8 is representative of inductor 36 of FIG. 7 and is of spiral design.

Figure 8B:
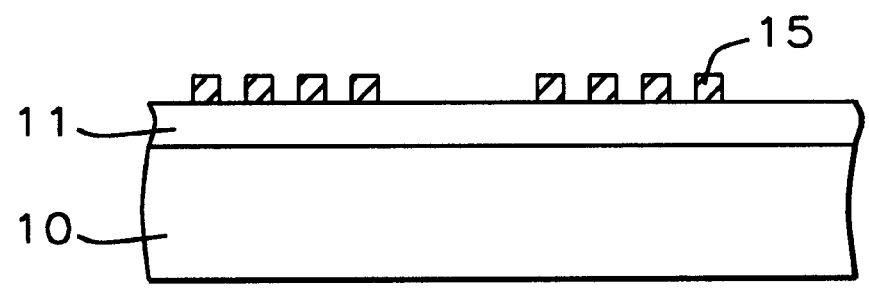
FIG. 8b shows a cross section of a typical inductor.

FIG. 8b shows a cross section of the inductor 21 taken along the line 8b–8b' of FIG. 8a with the silicon substrate 10, the cross section pattern 15 and the layer 11 of $SiO_2$ that is first deposited over the surface of substrate 10.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating a high-Q inductor on a surface of a semiconductor substrate, comprising the steps of:
providing a semiconductor substrate whereby a surface of said substrate is divided into an active region adjacent to a region of electrical isolation adjacent to a region over which at least one inductor is to be created;
performing an N+ implant into a surface of said substrate thereby whereby said region of N+ implant is located in said region of electrical isolation and immediately adjacent to said region over which at least one inductor is to be created;
creating a trench for a first Shallow Trench Isolation in a surface of said substrate whereby said trench for a first Shallow Trench Isolation is located in said region of electrical isolation and immediately adjacent to said active region;
creating a trench for a second Shallow Trench Isolation in the surface of said substrate whereby said trench for a second Shallow Trench Isolation is adjacent to said N+ implant and underlies said surface region of said substrate over which at least one inductor is to be created;
depositing and patterning a thick layer of protective material whereby said pattern removes said protective material from above said trench for a second Shallow Trench Isolation thereby exposing said trench for a second Shallow Trench Isolation;
performing a high-energy ion implant into said exposed trench for a second Shallow Trench Isolation;
removing said thick layer of protective material; and
performing backend processing thereby creating conducting interconnects to at least one point of electrical contact to devices contained in said active regions thereby furthermore creating at least one inductor overlying said surface region of said substrate over which at least one inductor is to be created.

2. The method of claim 1 wherein said backend processing comprises the steps of:
depositing a layer electrically isolating material in said trench for a first Shallow Trench Isolation and in said trench for a second Shallow Trench Isolation and planarizing a surface of said deposited layer of electrically isolating material down to a surface of said substrate;
depositing a layer of low-K polysilicon over a surface of said substrate;
creating a first pattern of redistribution vias in said layer of low-K polysilicon whereby said first pattern aligns with at least one point of electrical contact of at least one active device in said active region of said substrate;
creating at least one inductor on a surface of said layer of low-K polysilicon;
depositing a layer of high-K polysilicon over a surface of said layer of low-K polysilicon;
creating a second pattern of redistribution vias in said layer of high-K polysilicon whereby said second pattern of redistribution vias aligns with said first pattern of redistribution vias in addition to connecting to at least one inductor; and
creating a network of conductive interconnect lines overlying said layer of high-K polysilicon whereby said network of conductive interconnect lines aligns with at least one point of electrical contact in said second pattern of redistribution vias.

3. The method of claim 1 wherein said performing an N+ implant into a surface of said substrate is implanting arson or phosphorous at an energy between about 25 and 75 KeV and a dose between about 5E11 and 5E13 atoms/cm$^3$.

4. The method of claim 1 wherein said thick layer of protective material contains material selected from the group containing photoresist and dielectric material and insulation material and passivation material or any other suitable material that can serve as an effective block to high-energy ion implant.

5. The method of claim 1 wherein said high-energy ion implant is an implant of either amorphous silicon or germanium or tin (Sn) performed at an energy of about 1 to 20 MeV and at a dose of about $1\times10^{15}$ to $1\times10^{16}$ atoms/cm$^2$.

6. The method of claim 1 with the additional processing steps of creating a liner of pad oxide on the inside surfaces of said trench for said first Shallow Trench Isolation and said trench for said second Shallow Trench Isolation to a thickness of between about 100 and 500 Angstrom through a thermal oxidation method at a temperature of about 900 degrees C. for a time period of about 10 to 20 minutes said additional processing steps to be performed immediately prior to said performing backend processing.

7. A method of creating a high-Q inductor on a surface of a semiconductor substrate, comprising the steps of:

providing a semiconductor substrate whereby a surface of said substrate is divided into an active region adjacent to a region of electrical isolation adjacent to a region over which at least one inductor is to be created;

performing an N+ implant into a surface of said substrate by implanting arson or phosphorous at an energy between about 25 and 75 KeV and a dose between about 5E11 and 5E13 atoms/cm$^3$ into a surface of said substrate thereby creating a region of N+ implant whereby said region of N+ implant is located in said region of electrical isolation and immediately adjacent to said region over which at least one inductor is to be created and is furthermore immediately adjacent said latter region;

creating a trench for a first Shallow Trench Isolation in a surface of said substrate whereby said trench for a first Shallow Trench Isolation is located in said region of electrical isolation and immediately adjacent to said active region furthermore creating a trench for a second Shallow Trench Isolation in a surface of said substrate whereby said trench for a second Shallow Trench Isolation is adjacent to said N+ implant and underlies said surface region of said substrate over which at least one inductor is to be created;

depositing and patterning a thick layer of protective material whereby said pattern removes said protective material from above said trench for a second Shallow Trench Isolation thereby exposing said trench for a second Shallow Trench Isolation;

performing a high-energy ion implant into said exposed trench for a second Shallow Trench Isolation by implanting amorphous silicon or germanium or tin performed at an energy of about 1 to 10 MeV and at a dose of about $1\times10^{15}$ to $1\times10^{16}$ atoms/cm;

removing said thick layer of protective material; and performing backend processing thereby creating conducting interconnects to at least one point of electrical contact to devices contained in said active regions thereby furthermore creating at least one inductor overlying said surface region of said substrate over which at least one inductor is to be created.

8. The method of claim 7 wherein said thick layer of protective material contains material selected from the group containing photoresist and dielectric material and insulation material and passivation material or any other suitable material that can serve as an effective block to high-energy ion implant.

9. The method of claim 7 wherein said backend processing comprises the steps of:

depositing a layer electrically isolating material in said trench for a first Shallow Trench Isolation and in said trench for a second Shallow Trench Isolation and planarizing a surface of said deposited layer of electrically isolating material down to a surface of said substrate;

depositing a layer of low-K polysilicon over a surface of said substrate;

creating a first pattern of redistribution vias in said layer of low-K polysilicon whereby said first pattern aligns with at least one point of electrical contact of at least one active device;

creating at least one inductor on a surface of said layer of low-K polysilicon;

depositing a layer of high-K polysilicon over a surface of said layer of low-K polysilicon;

creating a second pattern of redistribution vias in said layer of high-K polysilicon whereby said second pattern of redistribution vias aligns with said first pattern of redistribution vias in addition to connecting to at least one inductor; and creating a network of conductive interconnect lines overlying said layer of high-K polysilicon whereby said network of conductive interconnect lines aligns with at least one point of electrical contact in said second pattern of redistribution vias.

10. The method of claim 7 with the addition processing steps of creating a liner of pad oxide on the inside surfaces of said trench for said first Shallow Trench Isolation and said trench for said second Shallow Trench Isolation to a thickness of between about 100 and 500 Angstrom through a thermal oxidation method at a temperature of about 900 degrees C. for a time period of about 10 to 20 minutes said additional processing steps to be performed.

* * * * *